United States Patent
Shi

(10) Patent No.: US 9,935,182 B2
(45) Date of Patent: Apr. 3, 2018

(54) METHOD OF FABRICATING THIN FILM TRANSISTOR STRUCTURE

(71) Applicant: SHENZHEN CHINA STAR OPTOELECTRONICS TECHNOLOGY CO., LTD., Shenzhen (CN)

(72) Inventor: Wen Shi, Shenzhen (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 20 days.

(21) Appl. No.: 15/308,690

(22) PCT Filed: Jun. 17, 2016

(86) PCT No.: PCT/CN2016/086219
§ 371 (c)(1),
(2) Date: Nov. 3, 2016

(87) PCT Pub. No.: WO2017/124690
PCT Pub. Date: Jul. 27, 2017

(65) Prior Publication Data
US 2018/0040721 A1 Feb. 8, 2018

(30) Foreign Application Priority Data
Jan. 19, 2016 (CN) .......................... 2016 1 0035727

(51) Int. Cl.
*H01L 21/00* (2006.01)
*H01L 29/66* (2006.01)
*H01L 21/441* (2006.01)
*H01L 21/027* (2006.01)
*H01L 29/786* (2006.01)

(52) U.S. Cl.
CPC ...... *H01L 29/66969* (2013.01); *H01L 21/027* (2013.01); *H01L 21/441* (2013.01); *H01L 29/7869* (2013.01)

(58) Field of Classification Search
CPC .......................... H01L 21/027; H01L 21/441
See application file for complete search history.

(56) References Cited

U.S. PATENT DOCUMENTS

| 9,129,992 B2 * | 9/2015 | Zhang ............... H01L 29/78648 |
| 9,401,321 B2 * | 7/2016 | Sagawa ............... H01L 27/3246 |
| 2012/0300147 A1 * | 11/2012 | Shieh .................. H01L 29/7869 349/42 |
| 2013/0119682 A1 * | 5/2013 | Matuschek ............. B60R 19/34 293/133 |
| 2013/0309808 A1 * | 11/2013 | Zhang ............... H01L 29/78648 438/104 |
| 2015/0102335 A9 * | 4/2015 | Shieh .................. H01L 29/7869 257/43 |

* cited by examiner

*Primary Examiner* — William Harriston
(74) *Attorney, Agent, or Firm* — Osha Liang LLP

(57) ABSTRACT

A method of fabricating a thin film transistor structure is described. An oxide semiconductor layer is fabricated by a self-aligned method and a lift-off process, and a source electrode and a drain electrode are fabricated by another lift-off process, so as to solve a problem in the conventional technology, wherein a semiconductor channel is damaged when an etching is performed, and a problem of raising a process cost due to the increasing complexity of the process.

15 Claims, 5 Drawing Sheets

METHOD OF FABRICATING THIN FILM TRANSISTOR STRUCTURE

FIELD OF THE INVENTION

The present invention relates to a method of fabricating a semiconductor structure, and more particularly to a method of fabricating a thin film transistor structure.

BACKGROUND OF THE INVENTION

Multiple steps of etching processes are required to fabricate devices of thin film transistors in conventional methods, wherein the etching processes include an etching of a semiconductor layer and an etching of source/drain electrodes. A complexity of a process is increased, and a process cost is increased accordingly. In addition, when the devices of thin film transistors are fabricated by using a conventional photolithography process, a semiconductor channel is frequently damaged during the etching of source/drain electrodes, thereby affecting electrical properties of the devices.

As a result, it is necessary to provide a method of fabricating a thin film transistor structure to solve the problems existing in the conventional technologies.

SUMMARY OF THE INVENTION

In view of this, the present invention provides a method of fabricating a thin film transistor structure to solve a problem in the conventional technology, wherein a semiconductor channel is damaged when an etching is performed, and a problem of raising a process cost due to increasing the complexity of the process.

A primary object of the present invention is to provide a method of fabricating a thin film transistor structure, which can use lift-off processes to solve a problem of damaging a semiconductor channel and simultaneously reduces the complexity of the process.

To achieve the above object, an embodiment of the present invention provides a method of fabricating a thin film transistor structure, wherein the method of fabricating a thin film transistor structure comprises steps of: providing a transparent substrate; forming a non-transparent gate pattern layer on the transparent substrate; covering a transparent gate insulating layer on the non-transparent gate pattern layer and the transparent substrate; forming a negative photoresist layer on the transparent gate insulating layer; using the non-transparent gate pattern layer as a mask, and providing an exposure light emitting in a direction from the transparent substrate toward the negative photoresist layer to pattern the negative photoresist layer in a self-aligned manner; forming an oxide semiconductor layer on the patterned negative photoresist layer and the transparent gate insulating layer; removing the negative photoresist layer to simultaneously remove the oxide semiconductor layer on the negative photoresist layer; forming a photoresist pattern layer on the oxide semiconductor layer and the transparent gate insulating layer to expose a source predetermining position and a drain predetermining position; covering a metal layer on the photoresist pattern layer, the source predetermining position and the drain predetermining position; removing the photoresist pattern layer and the metal layer on the photoresist pattern layer such that the metal layer on the source predetermining position forms a source electrode and the metal layer on the drain predetermining position forms a drain electrode; wherein a material of the non-transparent gate pattern layer includes aluminum, molybdenum or copper; and the photoresist pattern layer is a positive photoresist or a negative photoresist.

In one embodiment of the present invention, the transparent substrate is a transparent glass substrate.

In one embodiment of the present invention, the transparent substrate is a transparent flexible substrate.

In one embodiment of the present invention, the non-transparent gate pattern layer is formed by a photolithographic mask method.

In one embodiment of the present invention, in the step of covering the transparent gate insulating layer on the non-transparent gate pattern layer and the transparent substrate, the transparent gate insulating layer is formed by a physical vapor deposition.

To achieve the above object, an embodiment of the present invention provides a method of fabricating a thin film transistor structure, wherein the method of fabricating a thin film transistor structure comprises steps of: providing a transparent substrate; forming a non-transparent gate pattern layer on the transparent substrate; covering a transparent gate insulating layer on the non-transparent gate pattern layer and the transparent substrate; forming a negative photoresist layer on the transparent gate insulating layer; using the non-transparent gate pattern layer as a mask, and providing an exposure light emitting in a direction from the transparent substrate toward the negative photoresist layer to pattern the negative photoresist layer in a self-aligned manner; forming an oxide semiconductor layer on the patterned negative photoresist layer and the transparent gate insulating layer; removing the negative photoresist layer to simultaneously remove the oxide semiconductor layer on the negative photoresist layer; forming a photoresist pattern layer on the oxide semiconductor layer and the transparent gate insulating layer to expose a source predetermining position and a drain predetermining position; covering a metal layer on the photoresist pattern layer, the source predetermining position and the drain predetermining position; and removing the photoresist pattern layer and the metal layer on the photoresist pattern layer such that the metal layer on the source predetermining position forms a source electrode and the metal layer on the drain predetermining position forms a drain electrode.

In one embodiment of the present invention, the transparent substrate is a transparent glass substrate.

In one embodiment of the present invention, the transparent substrate is a transparent flexible substrate.

In one embodiment of the present invention, the photoresist pattern layer is a positive photoresist or a negative photoresist.

In one embodiment of the present invention, a material of the non-transparent gate pattern layer includes aluminum, molybdenum, or copper.

In one embodiment of the present invention, the non-transparent gate pattern layer is formed by a photolithographic mask method.

In one embodiment of the present invention, in the step of covering the transparent gate insulating layer on the non-transparent gate pattern layer and the transparent substrate, the transparent gate insulating layer is formed by a physical vapor deposition.

To achieve the above object, an embodiment of the present invention provides a method of fabricating a thin film transistor structure, wherein the method of fabricating a thin film transistor structure comprises steps of: providing a transparent substrate; forming a non-transparent gate pattern layer on the transparent substrate; covering a transparent gate insulating layer on the non-transparent gate pattern layer and the transparent substrate; forming a negative photoresist layer on the transparent gate insulating layer; using the non-transparent gate pattern layer as a mask, and providing an exposure light emitting in a direction from the transparent substrate toward the negative photoresist layer to pattern the negative photoresist layer in a self-aligned manner; forming an oxide semiconductor layer on the patterned negative photoresist layer and the transparent gate insulating layer; removing the negative photoresist layer to simultaneously remove the oxide semiconductor layer on the negative photoresist layer; forming a photoresist pattern layer on the oxide semiconductor layer and the transparent gate insulating layer to expose a source predetermining position and a drain predetermining position; covering a metal layer on the photoresist pattern layer, the source predetermining position and the drain predetermining position; removing the photoresist pattern layer and the metal layer on the photoresist pattern layer such that the metal layer on the source predetermining position forms a source electrode and the metal layer on the drain predetermining position forms a drain electrode; and covering a passivation layer on the source electrode, the drain electrode, the oxide semiconductor layer and the transparent gate insulating layer.

In one embodiment of the present invention, the transparent substrate is a transparent glass substrate.

In one embodiment of the present invention, the transparent substrate is a transparent flexible substrate.

In comparison with the conventional technology, in the method of fabricating the thin film transistor structure of the present invention, an oxide semiconductor layer, a source electrode, and a drain electrode are fabricated by lift-off processes, so as to solve a problem in the conventional technology of damaging a semiconductor channel when an etching is performed, and a problem of raising a process cost due to the increasing complexity of the process.

To make the above description of the present invention more clearly comprehensible, it is described in detail below in examples of preferred embodiments with the accompanying drawings.

DETAILED DESCRIPTION OF THE PREFERRED EMBODIMENTS

The following description of the embodiments with reference to the appended drawings is used for illustrating specific embodiments which may be used for carrying out the present invention. Furthermore, the directional terms described by the present invention, such as upper, lower, top, bottom, front, back, left, right, inner, outer, side, around, center, horizontal, lateral, vertical, longitudinal, axial, radial, uppermost or lowermost, etc., are only directions by referring to the accompanying drawings. Thus, the used directional terms are used to describe and understand the present invention, but the present invention is not limited thereto.

Figure 1:
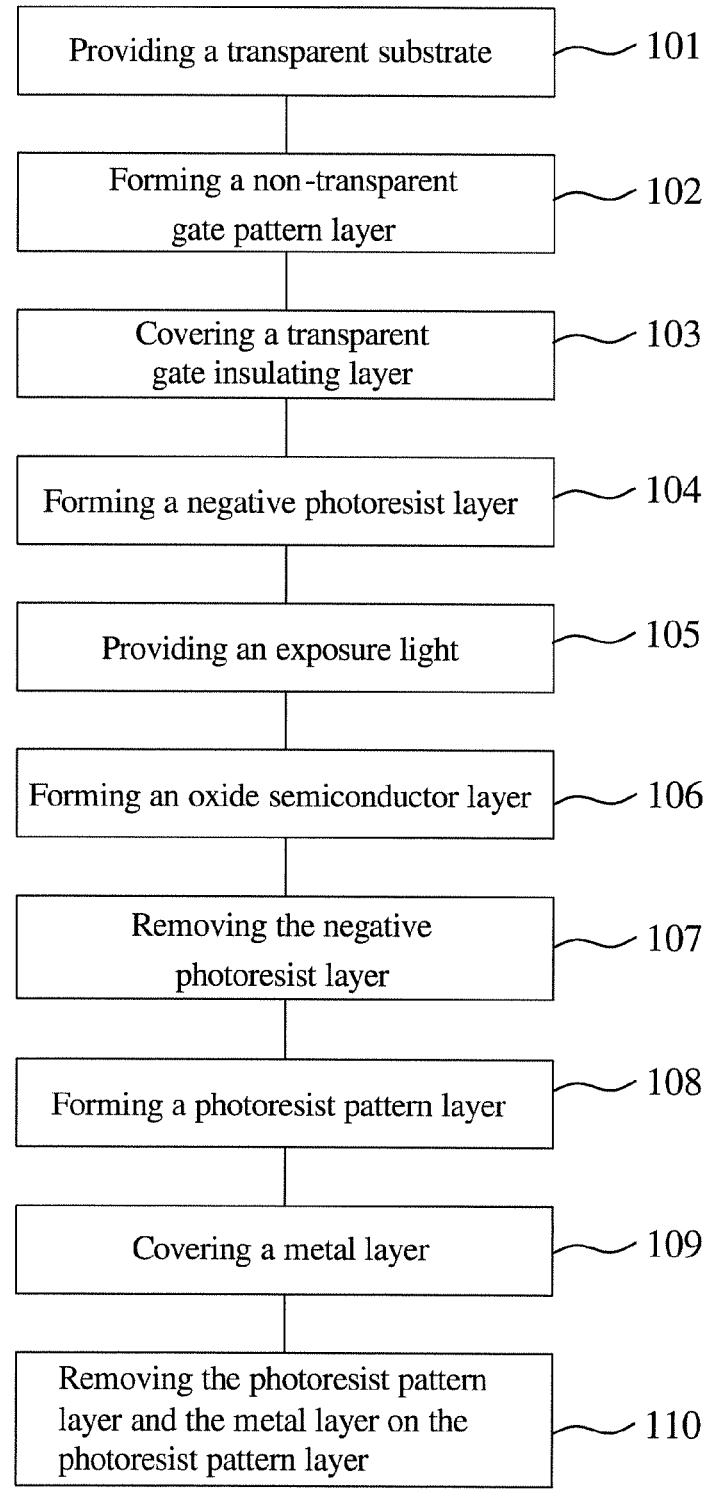
FIG. 1 is a flow chart showing a method of fabricating a thin film transistor structure according to an embodiment of the present invention.

Please refer to FIG. 1. FIG. 1 is a flow chart showing a method 10 of fabricating a thin film transistor structure according to an embodiment of the present invention. A method 10 of fabricating a thin film transistor structure of an embodiment of the present invention comprises steps of: providing a transparent substrate (step 101); forming a non-transparent gate pattern layer on the transparent substrate (step 102); covering a transparent gate insulating layer on the non-transparent gate pattern layer and the transparent substrate (step 103); forming a negative photoresist layer on the transparent gate insulating layer (step 104); using the non-transparent gate pattern layer as a mask, and providing an exposure light emitting in a direction from the transparent substrate toward the negative photoresist layer to pattern the negative photoresist layer in a self-aligned manner (step 105); forming an oxide semiconductor layer on the patterned negative photoresist layer and the transparent gate insulating layer (step 106); removing the negative photoresist layer to simultaneously remove the oxide semiconductor layer on the negative photoresist layer (step 107); forming a photoresist pattern layer on the oxide semiconductor layer and the transparent gate insulating layer to expose a source predetermining position and a drain predetermining position (step 108); covering a metal layer on the photoresist pattern layer, the source predetermining position, and the drain predetermining position (step 109); and removing the photoresist pattern layer and the metal layer on the photoresist pattern layer such that the metal layer on the source predetermining position forms a source electrode and the metal layer on the drain predetermining position forms a drain electrode (step 110).

Figure 2A:
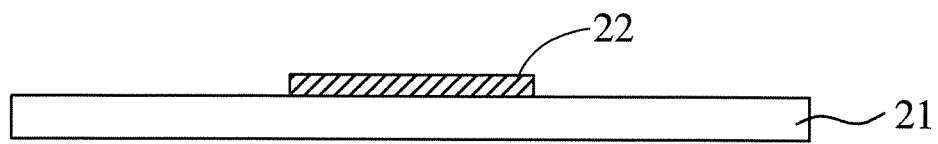
FIGS. 2A to 2I are cross-sectional schematic diagrams showing of a method of fabricating a thin film transistor structure in each of the processes according to an embodiment of the present invention.
Figure 2B:
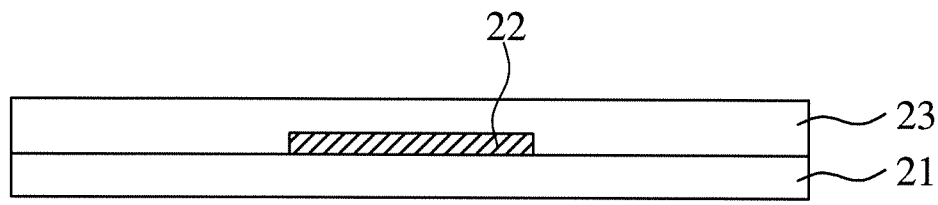
Figure 2C:
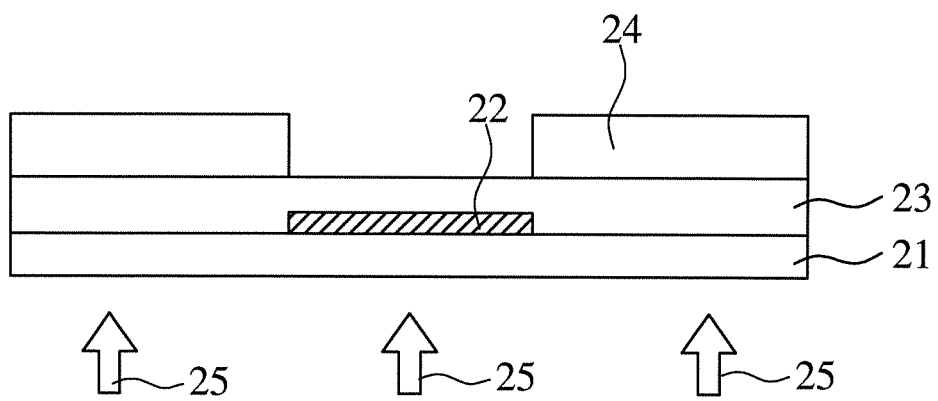
Figure 2D:
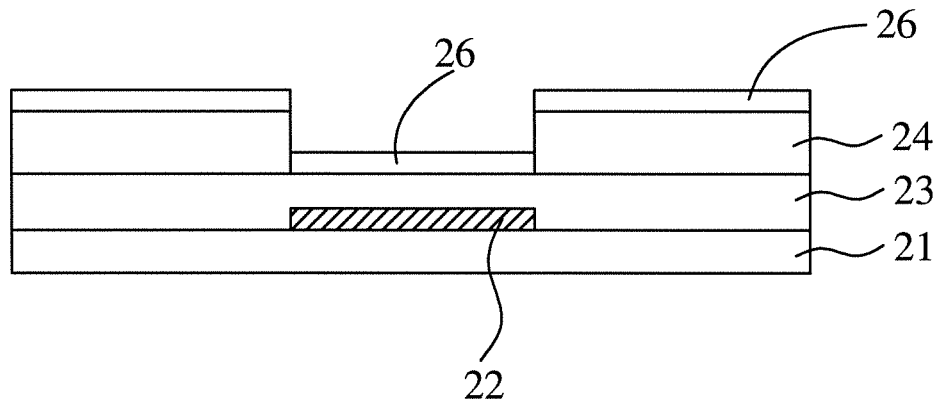
Figure 2E:
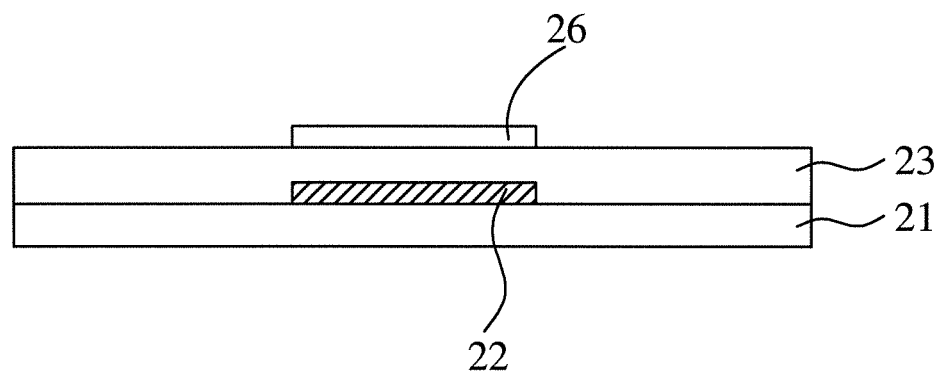
Figure 2F:
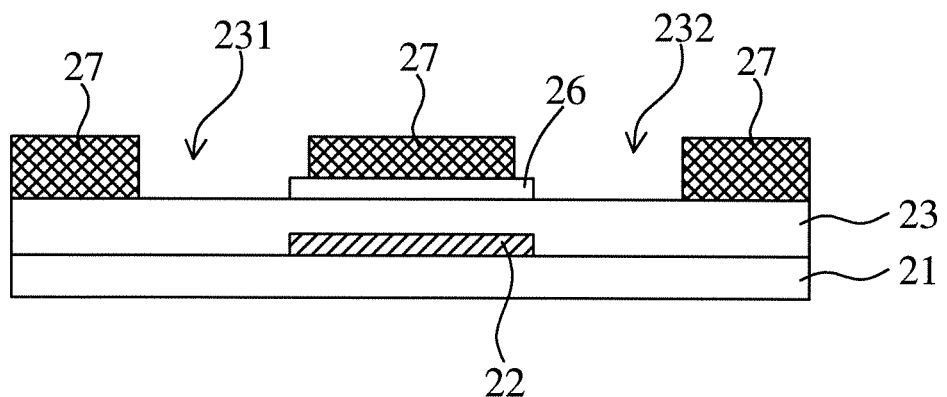
Figure 2G:
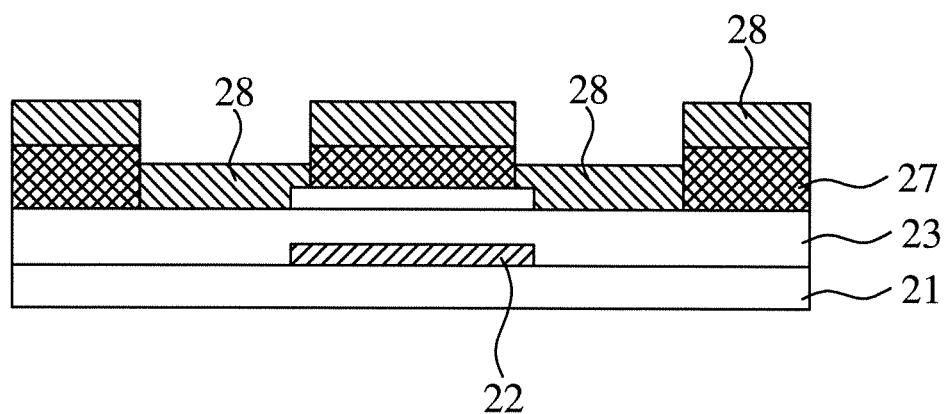
Figure 2H:
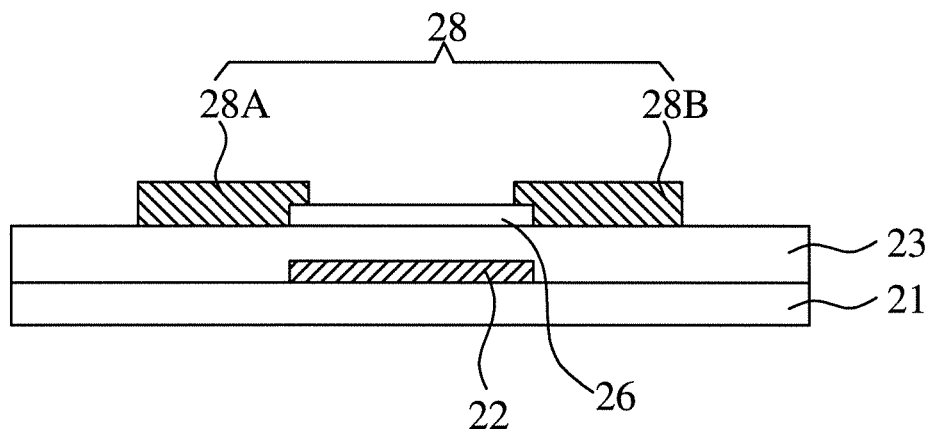
Figure 2I:
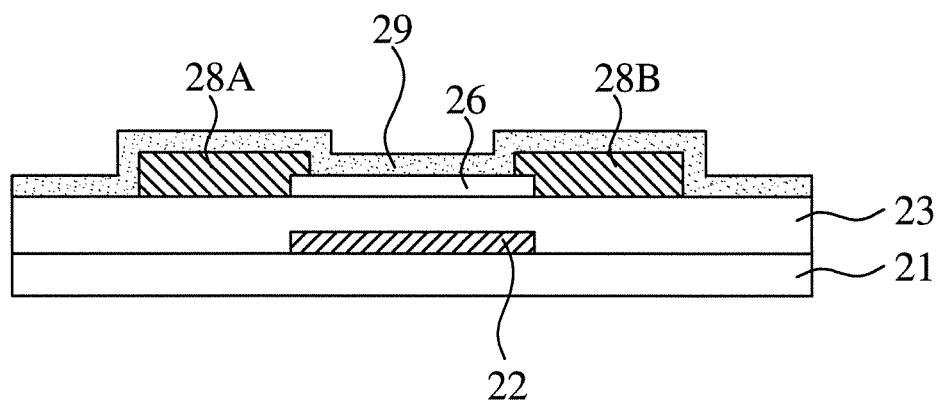

Please refer to FIGS. 1 to 2I together. FIGS. 2A to 2I are cross-sectional schematic diagrams showing a method 10 of fabricating a thin film transistor structure in each of the processes according to an embodiment of the present invention. Please refer to FIGS. 1 and 2A together. In step 101, in the method of fabricating the thin film transistor structure of the present invention, a transparent substrate 21 is first provided. In one embodiment, the transparent substrate 21 can be a transparent glass substrate. In another embodiment, the transparent substrate 21 can be a transparent flexible substrate. Then, in step 102, in the method of fabricating the thin film transistor structure of the present invention, a non-transparent gate pattern layer 22 is formed on the transparent substrate 21. In one embodiment, a material of the non-transparent gate pattern layer 22 includes aluminum, molybdenum, or copper. In another embodiment, the non-transparent gate pattern layer 22 is formed by a photolithographic mask method.

Please refer to FIGS. 1 and 2B together. In step 103, in the method of fabricating the thin film transistor structure of the present invention, a transparent gate insulating layer 23 covers on the non-transparent gate pattern layer 22 and the transparent substrate 21. In one embodiment, a material of the transparent gate insulating layer 23 is an oxide. In another embodiment, the transparent gate insulating layer 23 is formed by using a physical vapor deposition method. It is noted that in step 103, the transparent gate insulating layer 23 is formed without the requirement of using a mask.

Please refer to FIGS. 1 and 2C together. In step 104, in the method of fabricating the thin film transistor structure of the present invention, a negative photoresist layer 24 is formed on the transparent gate insulating layer 23. In one embodiment, the negative photoresist layer 24 is uniformly coated on the transparent gate insulating layer 23. In step 105, in the method of fabricating the thin film transistor structure of the present invention, the non-transparent gate pattern layer 23 is used as a mask, and an exposure light 25 is provided to emit in a direction from the transparent substrate 21 toward the negative photoresist layer 24 to pattern the negative photoresist layer 24 in a self-aligned manner. In more detail, in a process of patterning the negative photoresist layer 24 of the present invention, an additional mask is not required, but the non-transparent gate pattern layer 22 is used to shield unnecessary portions of the negative photoresist layer 24. The negative photoresist layer 24 will harden or be macromolecular after being emitted by the exposure light 25, so the negative photoresist layer 24 which is not emitted will be removed after a developing process, so as to complete an effect of pattern the negative photoresist layer 24 in a self-aligned manner. It is noted that during patterning the negative photoresist layer 24 in a self-aligned manner of the present invention, an additional mask is not required, so the complexity of the process can be reduced when the thin film transistor structure of an embodiment of the present invention is fabricated.

Please refer to FIGS. 1 and 2D together. In step 106, an oxide semiconductor layer 26 is formed on the patterned negative photoresist layer 24 and the transparent gate insulating layer 23 in the method of fabricating the thin film transistor structure of the present invention. In one embodiment, the oxide semiconductor layer 26 uses no mask, but is deposited on the negative photoresist layer 24 and the transparent gate insulating layer 23 in an equal or approximate thickness. In another embodiment, the oxide semiconductor layer 26 is formed on the negative photoresist layer 24 and the transparent gate insulating layer 23 by using a physical vapor deposition method or a chemical vapor deposition method.

Please refer to FIGS. 1 and 2E together. In step 107, in the method of fabricating the thin film transistor structure of the present invention, the negative photoresist layer 24 is removed to simultaneously remove the oxide semiconductor layer 26 on the negative photoresist layer 24, so as to pattern the oxide semiconductor layer 26 located on the transparent gate insulating layer 23. In one embodiment, step 106 and step 107 can be referred as a lift-off process. In the method 10 of fabricating the thin film transistor structure of the present invention, an etching process is not used but the lift-off process of the oxide semiconductor layer 26 is used to reduce the complexity of the process.

Please refer to FIGS. 1 and 2F together. In step 108, in the method of fabricating the thin film transistor structure of the present invention, a photoresist pattern layer 27 is formed on the oxide semiconductor layer 26 and the transparent gate insulating layer 23 to expose a source predetermining position 231 and a drain predetermining position 232. In one embodiment, a positive photoresist or a negative photoresist can be uniformly coated to completely cover with the oxide semiconductor layer 26 and the transparent gate insulating layer 23, and then an exposure process is performed by using a mask and followed by a develop process, so as to expose the source predetermining position 231 and the drain predetermining position 232.

Please refer to FIGS. 1 and 2G together. In step 109, in the method of fabricating the thin film transistor structure of the present invention, a metal layer 28 covers on the photoresist pattern layer 27, the source predetermining position 231 and the drain predetermining position 232. In one embodiment, the metal layer 28 uses of no mask, but is deposited on the photoresist pattern layer 27, the source predetermining position 231 and the drain predetermining position 232 in an equal or approximate thickness. In another embodiment, the metal layer 28 is formed on the photoresist pattern layer 27, the source predetermining position 231 and the drain predetermining position 232 by using a physical vapor deposition method or a chemical vapor deposition method.

Please refer to FIGS. 1 and 2H together. In step 110, in the method of fabricating the thin film transistor structure of the present invention, the photoresist pattern layer 27 and the metal layer 28 on the photoresist pattern layer 27 are removed such that the metal layer 28 on the source predetermining position 231 forms a source electrode 28A and the metal layer 28 on the drain predetermining position 232 forms a drain electrode 28B, thereby fabricating the thin film transistor structure 20 of the embodiment of the present invention. In one embodiment, step 109 and step 110 can be referred to as a lift-off process. In the method 10 of fabricating the thin film transistor structure of the present invention, an etching process is not used but the lift-off process of the metal layer 28 is used to form the source electrode 28A and the drain electrode 28B. Therefore, in addition to reducing the complexity of the process, the problem of affecting electrical properties of the devices due to a semiconductor channel damaged during a conventional etching process being performed on the source/drain electrode, is further avoided.

Please refer to FIG. 2I. In one embodiment, after the step 110 is performed in the method of fabricating the thin film transistor structure of the present invention, a passivation layer 29 covers on the source electrode 28A, the drain electrode 28B, the oxide semiconductor layer 26 and the transparent gate insulating layer 23, so as to prevent the source electrode 28A and the drain electrode 28B from oxidation or corrosion.

From the above, in the method of fabricating the thin film transistor of the embodiment of the present invention, an oxide semiconductor layer is fabricated by a self-aligned method and a lift-off process, and a source electrode and a drain electrode are fabricated by another lift-off process, so as to solve a problem in the conventional technology wherein a semiconductor channel is damaged when an etching is performed, and a problem of raising a process cost due to the increasing complexity of the process.

The present invention has been described in relative embodiments described above. However, the above embodiments are merely examples of performing the present invention. It must be noted that the implementation of the disclosed embodiments does not limit the scope of the invention. On the contrary, modifications and equal settings included in the spirit and scope of the claims are all included in the scope of the present invention.

What is claimed is:
1. A method of fabricating a thin film transistor structure, comprising steps of:
providing a transparent substrate;
forming a non-transparent gate pattern layer on the transparent substrate;
covering a transparent gate insulating layer on the non-transparent gate pattern layer and the transparent substrate;
forming a negative photoresist layer on the transparent gate insulating layer;
using the non-transparent gate pattern layer as a mask, and providing an exposure light emitting in a direction from the transparent substrate toward the negative photoresist layer to pattern the negative photoresist layer in a self-aligned manner;
forming an oxide semiconductor layer on the patterned negative photoresist layer and the transparent gate insulating layer;

removing the negative photoresist layer to simultaneously remove the oxide semiconductor layer on the negative photoresist layer;

forming a photoresist pattern layer on the oxide semiconductor layer and the transparent gate insulating layer to expose a source predetermining position and a drain predetermining position;

covering a metal layer on the photoresist pattern layer, the source predetermining position and the drain predetermining position;

removing the photoresist pattern layer and the metal layer on the photoresist pattern layer such that the metal layer on the source predetermining position forms a source electrode and the metal layer on the drain predetermining position forms a drain electrode;

wherein a material of the non-transparent gate pattern layer includes aluminum, molybdenum, or copper; and wherein the photoresist pattern layer is a positive photoresist or a negative photoresist.

2. The method of fabricating a thin film transistor structure according to claim 1, wherein the transparent substrate is a transparent glass substrate.

3. The method of fabricating a thin film transistor structure according to claim 1, wherein the transparent substrate is a transparent flexible substrate.

4. The method of fabricating a thin film transistor structure according to claim 1, wherein the non-transparent gate pattern layer is formed by a photolithographic mask method.

5. The method of fabricating a thin film transistor structure according to claim 1, wherein in the step of covering the transparent gate insulating layer on the non-transparent gate pattern layer and the transparent substrate, the transparent gate insulating layer is formed by a physical vapor deposition.

6. A method of fabricating a thin film transistor structure, comprising steps of:

providing a transparent substrate;

forming a non-transparent gate pattern layer on the transparent substrate;

covering a transparent gate insulating layer on the non-transparent gate pattern layer and the transparent substrate;

forming a negative photoresist layer on the transparent gate insulating layer;

using the non-transparent gate pattern layer as a mask, and providing an exposure light emitting in a direction from the transparent substrate toward the negative photoresist layer to pattern the negative photoresist layer in a self-aligned manner;

forming an oxide semiconductor layer on the patterned negative photoresist layer and the transparent gate insulating layer;

removing the negative photoresist layer to simultaneously remove the oxide semiconductor layer on the negative photoresist layer;

forming a photoresist pattern layer on the oxide semiconductor layer and the transparent gate insulating layer to expose a source predetermining position and a drain predetermining position;

covering a metal layer on the photoresist pattern layer, the source predetermining position and the drain predetermining position; and removing the photoresist pattern layer and the metal layer on the photoresist pattern layer such that the metal layer on the source predetermining position forms a source electrode and the metal layer on the drain predetermining position forms a drain electrode.

7. The method of fabricating a thin film transistor structure according to claim 6, wherein the transparent substrate is a transparent glass substrate.

8. The method of fabricating a thin film transistor structure according to claim 6, wherein the transparent substrate is a transparent flexible substrate.

9. The method of fabricating a thin film transistor structure according to claim 6, wherein the photoresist pattern layer is a positive photoresist or a negative photoresist.

10. The method of fabricating a thin film transistor structure according to claim 6, wherein a material of the non-transparent gate pattern layer includes aluminum, molybdenum, or copper.

11. The method of fabricating a thin film transistor structure according to claim 6, wherein the non-transparent gate pattern layer is formed by a photolithographic mask method.

12. The method of fabricating a thin film transistor structure according to claim 6, wherein in the step of covering the transparent gate insulating layer on the non-transparent gate pattern layer and the transparent substrate, the transparent gate insulating layer is formed by a physical vapor deposition.

13. A method of fabricating a thin film transistor structure, comprising steps of:

providing a transparent substrate;

forming a non-transparent gate pattern layer on the transparent substrate;

covering a transparent gate insulating layer on the non-transparent gate pattern layer and the transparent substrate;

forming a negative photoresist layer on the transparent gate insulating layer;

using the non-transparent gate pattern layer as a mask, and providing an exposure light emitting in a direction from the transparent substrate toward the negative photoresist layer to pattern the negative photoresist layer in a self-aligned manner;

forming an oxide semiconductor layer on the patterned negative photoresist layer and the transparent gate insulating layer;

removing the negative photoresist layer to simultaneously remove the oxide semiconductor layer on the negative photoresist layer;

forming a photoresist pattern layer on the oxide semiconductor layer and the transparent gate insulating layer to expose a source predetermining position and a drain predetermining position;

covering a metal layer on the photoresist pattern layer, the source predetermining position and the drain predetermining position;

removing the photoresist pattern layer and the metal layer on the photoresist pattern layer such that the metal layer on the source predetermining position forms a source electrode and the metal layer on the drain predetermining position forms a drain electrode; and covering a passivation layer on the source electrode, the drain electrode, the oxide semiconductor layer and the transparent gate insulating layer.

14. The method of fabricating a thin film transistor structure according to claim 13, wherein the transparent substrate is a transparent glass substrate.

15. The method of fabricating a thin film transistor structure according to claim 13, wherein the transparent substrate is a transparent flexible substrate.

* * * * *